(12) United States Patent
Matsuda

(10) Patent No.: US 7,326,958 B2
(45) Date of Patent: Feb. 5, 2008

(54) SOLID STATE IMAGING DEVICE

(75) Inventor: Yuji Matsuda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 49 days.

(21) Appl. No.: 11/406,288

(22) Filed: Apr. 19, 2006

(65) Prior Publication Data

US 2006/0237722 A1   Oct. 26, 2006

(30) Foreign Application Priority Data

Apr. 26, 2005   (JP) .............................. 2005-128455

(51) Int. Cl.
*H01L 29/04* (2006.01)

(52) U.S. Cl. ...................... 257/59; 257/72; 257/E27.15

(58) Field of Classification Search ................ 257/291, 257/294, 249, 246, E27.15, E27.152, 59, 257/72
See application file for complete search history.

(56) References Cited

U.S. PATENT DOCUMENTS

| | | | | |
|---|---|---|---|---|
| 5,216,489 A | * | 6/1993 | Yonemoto et al. | 377/60 |
| 5,438,365 A | * | 8/1995 | Yamashita et al. | 348/297 |
| 6,211,915 B1 | * | 4/2001 | Harada | 348/298 |
| 7,138,619 B1 | * | 11/2006 | Ferrante et al. | 250/216 |
| 7,193,252 B2 | * | 3/2007 | Miyaguchi | 257/249 |
| 7,209,169 B2 | * | 4/2007 | Matsumoto et al. | 348/302 |

FOREIGN PATENT DOCUMENTS

| | | |
|---|---|---|
| JP | 57-087145 | 5/1982 |
| JP | 63-114222 | 5/1988 |
| JP | 2004-207804 | 7/2004 |

\* cited by examiner

*Primary Examiner*—Howard Weiss
*Assistant Examiner*—(Vikki) Hoa B Trinh
(74) *Attorney, Agent, or Firm*—McDermott Will & Emery LLP

(57) ABSTRACT

A solid state imaging device includes: a plurality of photoelectric conversion elements which are arranged in a two-dimensional matrix on a semiconductor chip; vertical transfer registers including a vertical transfer channel and vertical transfer electrodes, respectively, for transferring signal charge read out of the photoelectric conversion elements in the vertical direction; a horizontal transfer register including a horizontal transfer channel and horizontal transfer electrodes for transferring the signal charge transferred from the vertical transfer registers in the horizontal direction; bus interconnects which are electrically connected to the vertical transfer electrodes and the horizontal transfer electrodes; and pads for external connection which are electrically connected to the bus interconnects. The pads are formed above the bus interconnects and the horizontal transfer electrodes.

7 Claims, 10 Drawing Sheets

SOLID STATE IMAGING DEVICE

CROSS-REFERENCE TO RELATED APPLICATION

This non-provisional application claims priority under 35 U.S.C. §119(a) of Japanese Patent Application No. 2005-128455 filed in Japan on Apr. 26, 2005, the entire contents of which are hereby incorporated by reference.

BACKGROUND OF THE INVENTION

1. Field of the Invention

The present invention relates to a solid state imaging device. In particular, it relates to a solid state imaging device which makes it possible to increase the number of pixels and the packaging density without increasing the chip size.

2. Description of Related Art

Hereinafter, an explanation of a conventional solid state imaging device will be provided with reference to the drawing (see Japanese Unexamined Patent Publication No. 2004-207804). FIG. 10 shows a plane structure of a solid state imaging device using a common charge-coupled device (CCD).

The solid state imaging device includes a plurality of pixels (sensor) 111 formed in a matrix on a semiconductor chip 101 and vertical transfer registers 112 extending in the column direction between the sensors 111 adjacent to each other. A horizontal transfer register 113 is arranged in the direction orthogonal to the vertical transfer registers 112 at the end of the vertical transfer registers 112.

At the periphery of a device region 102 of the semiconductor chip 101 in which the pixels 111, vertical transfer registers 112 and horizontal transfer register 113 have been formed, an output buffer 114 is provided and connected to the end of the horizontal transfer register 113 to transfer signal charge received from the horizontal transfer register 113 into a voltage signal for output.

Further, interconnects for supplying a drive signal to the vertical transfer registers 112 and the horizontal transfer register 113 are provided in an interconnect region 103 and a plurality of pads 115 for external connection are provided in a pad region 104 outside the interconnect region 103.

In FIG. 10, only a few pixels 111, vertical transfer registers 112 and pads 115 are shown for simplification. The number of the horizontal transfer register 113 is not limited to one. In some cases, a plurality of horizontal transfer registers 113 may be formed.

Next, with reference to the drawing, an explanation of the structure of a common bonding pad aimed at the reduction of chip size (see Japanese Unexamined Patent Publication No. S57-87145).

FIG. 11 is a sectional view illustrating the structure of a conventional semiconductor device. As shown in FIG. 11, a drain region 121 and a source region 122 made of an impurity diffusion layer are formed in the surface of a semiconductor chip 120 to be spaced from each other and a gate electrode 123 is formed between the drain region 121 and the source region 122 to provide a transistor. Electrode wires 124 and 125 are connected to the drain region 121 and the source region 122, respectively. The gate electrode 123 and the electrode wires 124 and 125 are covered with an interlayer insulating film 126 and a pad 127 for external connection is formed on the interlayer insulating film 126 to overlap the transistor.

As the device region and the pad region vertically overlap, the ratio of the device region to the chip area increases, thereby increasing the packing density of the chip.

In electronic industry, there is a great demand for devices with reduced size and higher performance. In the field of semiconductors, what is required is an increase in packing density of the chip, i.e., reduction in chip size with the performance unchanged and improvement in performance with the chip size unchanged.

From this aspect, in a semiconductor device including a solid state imaging device, components of the device such as impurity diffusion regions, transfer electrodes and interconnects have been miniaturized in order to reduce the chip size and improve the performance with the chip size unchanged.

However, the miniaturization of the impurity diffusion regions and the interconnects leads to deterioration in characteristic of the transistor. In addition, new facilities and new processes must be introduced and the cost increases. If the impurity diffusion regions serving as the pixels of the solid state imaging device are reduced in size, the amount of incident light decreases. As a result, the solid state imaging device deteriorates in sensitivity, saturation characteristic and S/N characteristic, which are important characteristics of the solid state imaging device.

The size of a semiconductor chip depends on the size of the device region in which active elements and passive elements are formed and the size of the pad region provided at the periphery of the device region in which bonding pads for wire bonding are formed. Therefore, in order to achieve both of the reduction of the chip size and the increase of the number of the pixels, it is effective to increase the ratio of the device region to the chip area, i.e., to make the pad region small.

However, if the pad structure as disclosed by Japanese Unexamined Patent Publication No. S57-87145 is applied to the conventional solid state imaging device of Japanese Unexamined Patent Publication No. 2004-207804, light incident on the pixels is cut off by the pads. As a result, the sensitivity and the saturation characteristic which are important for the solid state imaging device deteriorate.

SUMMARY OF THE INVENTION

In order to solve the above-described conventional problems, the present invention intends to increase the ratio of the device region in which the pixels are formed to the chip area without hindering the entrance of light into the pixels, thereby achieving a solid state imaging device with high packing density.

In order to achieve the above-described object, in the solid state imaging device according to the present invention, pads for external connection are formed in a interconnect region.

Specifically, the solid state imaging device according to the present invention includes: a plurality of photoelectric conversion elements which are arranged in a two-dimensional matrix on a semiconductor chip; vertical transfer registers including a vertical transfer channel and vertical transfer electrodes, respectively, for transferring signal charge read out of the photoelectric conversion elements in the vertical direction; a horizontal transfer register including a horizontal transfer channel and horizontal transfer electrodes for transferring the signal charge transferred from the vertical transfer registers in the horizontal direction; bus interconnects which are electrically connected to the vertical transfer electrodes and the horizontal transfer electrodes; and pads for external connection which are electrically connected to the bus interconnects, wherein the pads are formed above the bus interconnects and the horizontal transfer electrodes.

According to the solid state imaging device of the present invention, a region for forming the pads for external connection and a region for interconnection are integrated. As a result, the ratio of the device region to the solid state imaging device increases. Further, since the region for forming the pads is completely separated from a region for forming the pixels, the pads will not hinder the entrance of light into the pixels.

As to the solid state imaging device of the present invention, the pads are preferably located above the horizontal transfer channel. According to the structure, the ratio of the area occupied by the pads is reduced to a further degree and the pads function as a light shield film. Therefore, the efficiency of horizontal charge transfer improves.

In this case, it is preferable that the horizontal transfer electrodes are conductive layers and the pads are metal layers. Further, the conductive layers are preferably made of polysilicon. According to the structure, light entering the horizontal transfer channel is effectively blocked by the pads.

As to the solid state imaging device of the present invention, the pads are preferably inclined from the main surface of the semiconductor chip. According to the structure, a mounting angle at which bonding wires are connected to the pads is reduced, thereby preventing the bonding wires from blocking the light incident on the pixels.

As to the solid state imaging device of the present invention, the pads are preferably electrically connected to the bus interconnects via contact plugs. According to the structure, the connection between the pads and the bus interconnects is simplified, thereby reducing the chip size to a further degree.

As to the solid state imaging device of the present invention, it is preferable that the photoelectric conversion elements, vertical transfer registers and horizontal transfer register provide a CCD image sensor.

DETAILED DESCRIPTION OF THE INVENTION

First Embodiment

Figure 1:
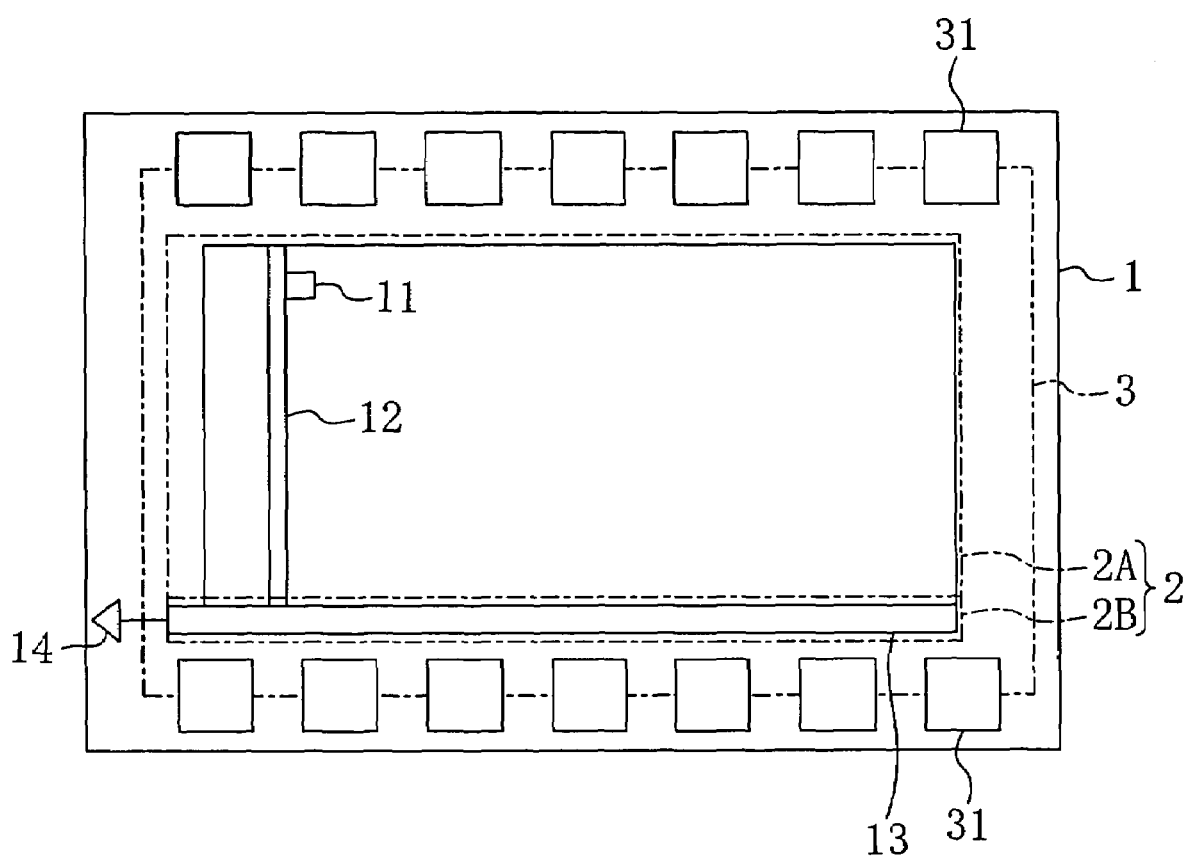
FIG. 1 is a plan view illustrating a solid state imaging device according to a first embodiment of the present invention.
Figure 2:
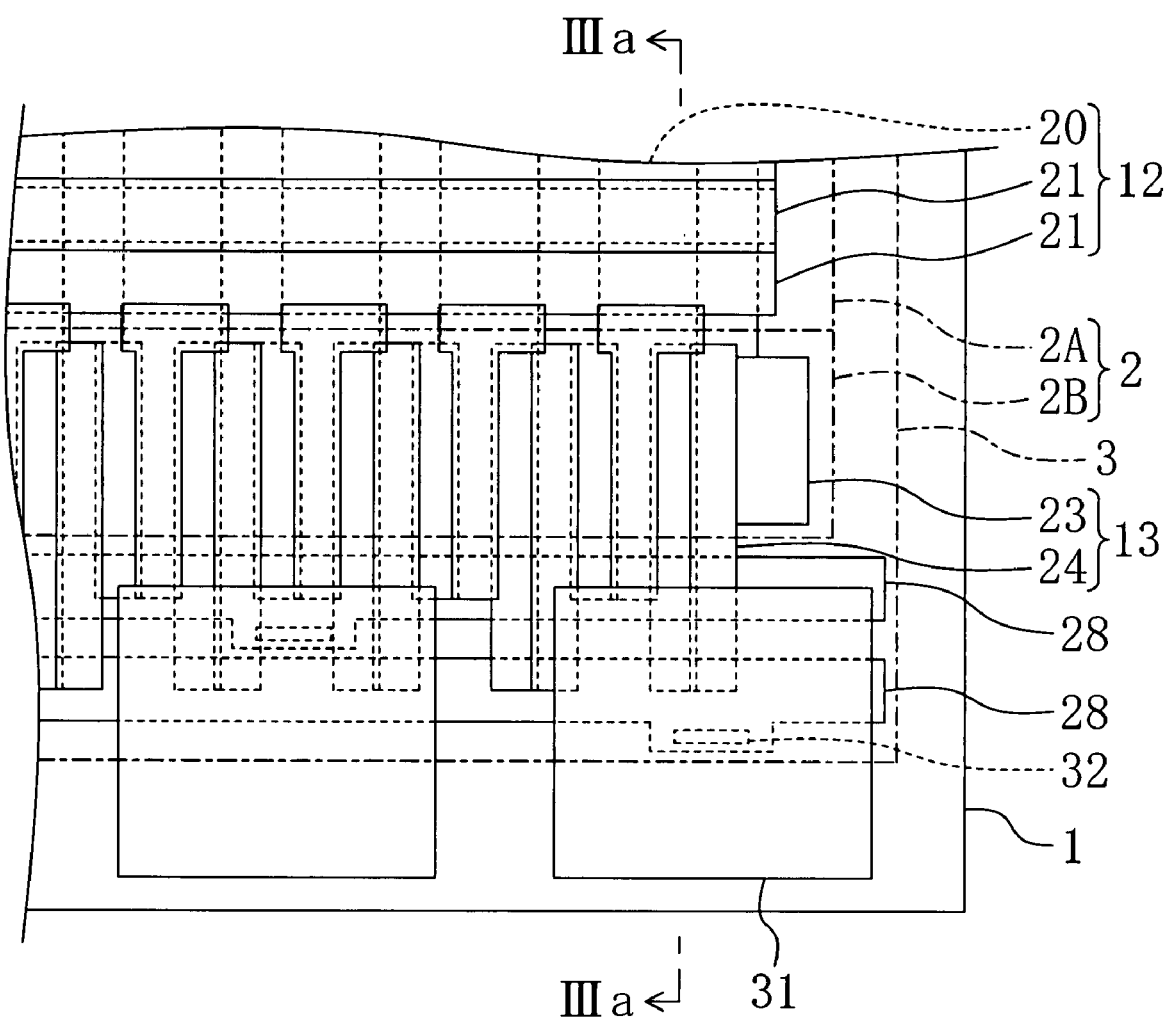
FIG. 2 is a plan view illustrating an enlargement of a major part of the solid state imaging device according to the first embodiment of the present invention.
Figure 3:
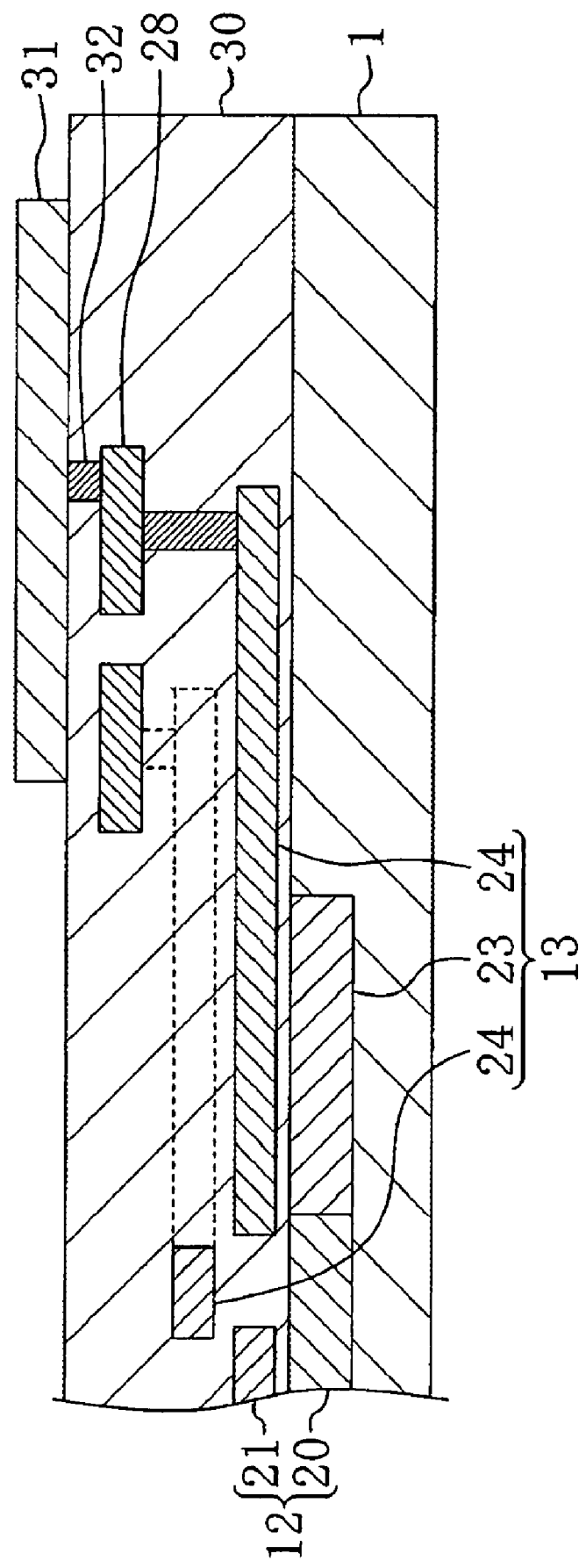
FIG. 3 is a sectional view illustrating an enlargement of a major part of the solid state imaging device according to the first embodiment of the present invention.

With reference to the drawings, an explanation of a solid state imaging device of the first embodiment of the present invention will be provided. FIGS. 1 to 3 show the solid state imaging device of the first embodiment. Specifically, FIG. 1 shows a plane structure, FIG. 2 is an enlargement of FIG. 1 and FIG. 3 shows a section taken along the line IIIa-IIIa of FIG. 2.

As shown in FIGS. 1 to 3, a plurality of pixels 11 are arranged in a matrix in a pixel region 2A of a semiconductor chip 1. The pixels 11 are photodiodes and generate signal charge corresponding to the intensity of light incident thereon.

Vertical transfer registers 12 extending in the column direction are arranged between the pixels 11 adjacent to each other. Each of the vertical transfer registers 12 includes a vertical transfer channel 20 which is an impurity diffusion layer formed in the surface of the semiconductor chip 1 and extends in the column direction and a plurality of vertical transfer electrodes 21 which are conductive layers made of polysilicon and arranged on every line on the vertical transfer channel 20.

When a vertical transfer clock pulse is applied to the vertical transfer electrodes 21, signal charge generated in the pixels 11 is sequentially transferred in the column direction and output to a horizontal transfer register 13 connected to the ends of the vertical transfer registers 12. The vertical transfer electrodes 21 of the vertical transfer registers 12 on the same line are integrated to be shared among the vertical transfer registers 12. The vertical transfer registers 12 are driven at the same time.

A horizontal transfer register 13 is formed in a horizontal transfer register region 2B adjacent to the pixel region 2A. The horizontal transfer register 13 extends in the line direction and is connected to the ends of the vertical transfer registers 12. The horizontal transfer register 13 includes a horizontal transfer channel 23 which is an impurity diffusion layer extending in the line direction and connected to the ends of the vertical transfer channels 20 and a plurality of horizontal transfer electrodes 24 which are conductive layers made of polysilicon and formed on the horizontal transfer channel 23.

When a horizontal transfer clock pulse is applied to the horizontal transfer electrodes 24, signal charge transferred from the vertical transfer registers 12 is sequentially transferred in the line direction and output to an output buffer 14.

A plurality of bus interconnects 28 for supplying the vertical transfer electrodes 21 and the horizontal transfer electrodes 24 with the transfer clock pulses are formed in a interconnect region 3 provided around a device region 2 in which the pixels 11, vertical transfer registers 12 and horizontal transfer register 13 have been formed.

The number of the bus interconnects 28 varies depending on how to drive the device. For example, 4 to 6 bus interconnects 28 are required in a common solid state imaging device having supply voltage bus lines in which the vertical transfer registers 12 are driven by a four-phase clock and the horizontal transfer register 13 is driven by a two-phase clock. The number of the vertical transfer registers increases to about 10 to 14 as the number of the pixels increases. FIGS. 2 and 3 show only two bus interconnects 28 connected to the horizontal transfer electrodes 24.

The bus interconnects 28 are metal layers made of aluminum or copper and buried in an interlayer insulating film 30 formed on the semiconductor chip 1. In the interconnect region 3, a plurality of pads 31 for external connection are formed on the top surface of the interlayer insulating film 30 to overlap with the bus interconnects 28. The pads 31 are metal layers made of aluminum, copper, gold or platinum.

The size of the chip for the solid state imaging device depends on the areas of the device region 2, interconnect region 3 and pad region. If the pads 31 are formed over the bus interconnects 28 formed in the interconnect region 3, there is no need of providing the pad region separately. Therefore, the chip size may be reduced. Further, as the ratio of the device region 2 to the chip area increases, the packing density of the solid state imaging device increases.

Further, since the pads 31 are not formed in the pixel region 2A, the pads 31 will not hinder the entrance of light into the pixels 11.

Moreover, the pads 31 and the bus interconnects 28 may be connected through via plugs 32. By so doing, interconnects for connecting the pads 31 and the bus interconnects 28 are omitted.

If an impurity diffusion region is formed below the pads 31, the impurity diffusion layer may deteriorate in characteristic due to an impact exerted thereon when the pads 31 are formed and a mechanical impact for bonding wires to the pads 31.

In the case of a CCD, in particular, the signal charge, which is image information, is transferred through the vertical transfer channels and the horizontal transfer channel which are the impurity diffusion regions. Therefore, the characteristic of the impurity diffusion regions has a significant effect on the image property.

In contrast, according to the solid state imaging device of the present embodiment, the pads 31 are formed in the interconnect region 3 established around the device region 2. Since the impurity diffusion region does not exist below the pads 31, the horizontal transfer channel, which is the impurity diffusion region, will not be damaged during the manufacture of the pads 31. Thus, in the solid state imaging device of the present embodiment, the chip is reduced in size without causing any problem in horizontal charge transfer.

More specifically, as to an imaging device of about 5 mm on a side which is often used in digital cameras, about 30 pads of about 100 μm on a side are formed in general.

In this case, in a conventional solid state imaging device, a region ranging about 0.3 mm from the periphery of the chip is required for the pad region and the interconnect region. Therefore, the device region actually occupies about 75% of the chip area.

In the solid state imaging device of the present embodiment, however, about 90% of the chip area is used as the device region because the pads for external connection are formed in the interconnect region. Thus, the solid state imaging device of the present embodiment makes it possible to increase the number of the pixels without increasing the chip size. If the number of the pixels is unchanged, the chip size is reduced.

Second Embodiment

Figure 4:
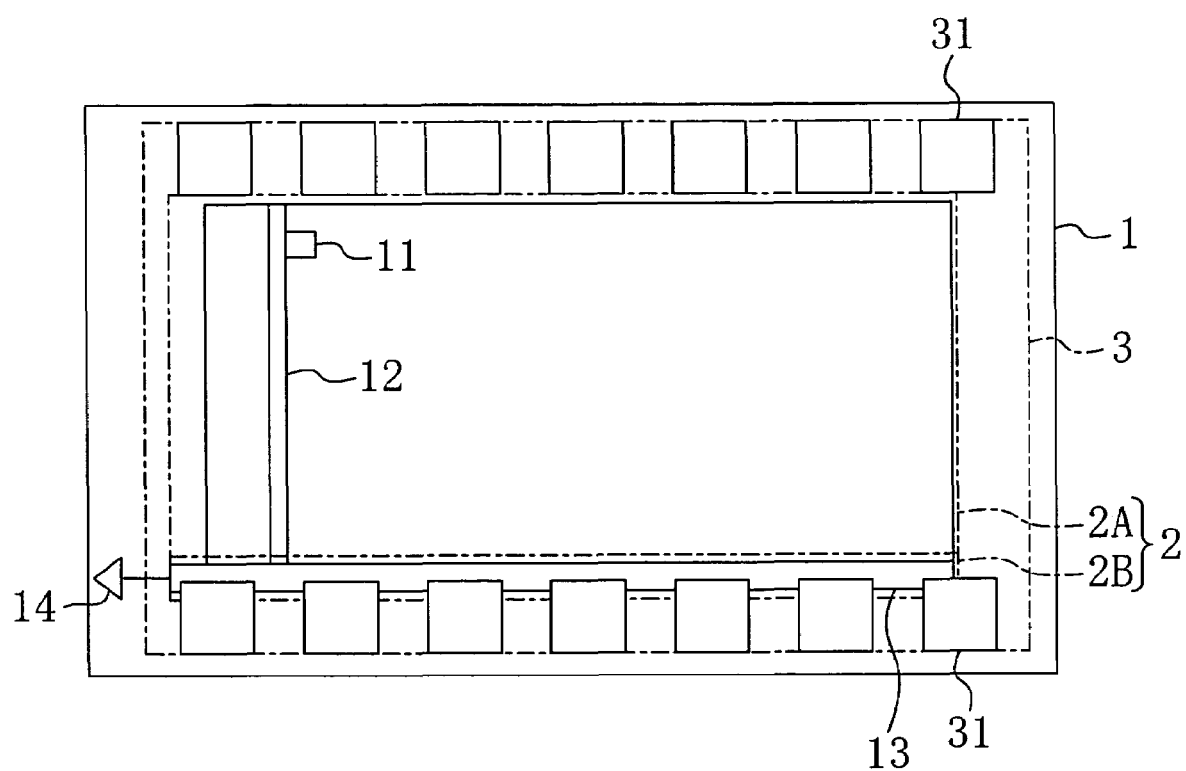
FIG. 4 is a plan view illustrating a solid state imaging device according to a second embodiment of the present invention.
Figure 5:
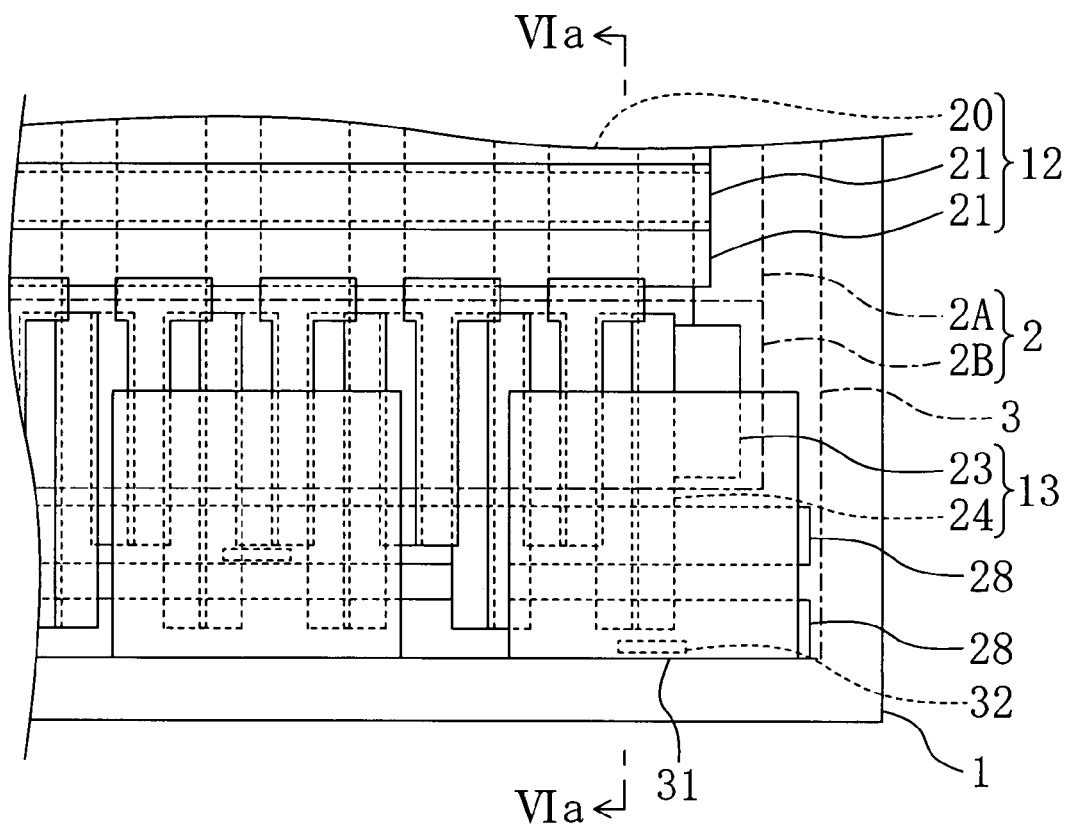
FIG. 5 is a plan view illustrating an enlargement of a major part of the solid state imaging device according to the second embodiment of the present invention.
Figure 6:
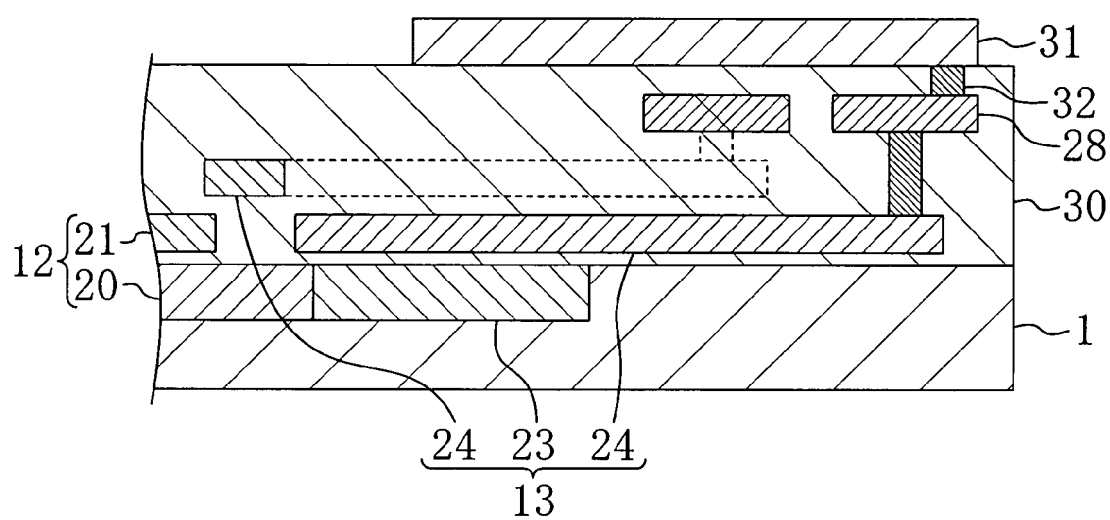
FIG. 6 a sectional view illustrating an enlargement of a major part of the solid state imaging device according to the second embodiment of the present invention.

Hereinafter, an explanation of a solid state imaging device according to a second embodiment of the present invention will be provided with reference to the drawings. FIGS. 4 to 6 show the solid state imaging device according to the second embodiment. Specifically, FIG. 4 shows a plane structure, FIG. 5 is an enlargement of FIG. 4 and FIG. 6 shows a section taken along the line VIa-VIa of FIG. 5. In FIGS. 4 to 6, the same components as those shown in FIGS. 1 to 3 are indicated by the same reference numerals to omit the explanation.

In the solid state imaging device of the present embodiment, the pads 31 for external connection are formed to overlap with the interconnect region 3 and the horizontal transfer register region 2B. Specifically, part of each pad 31 is located above the horizontal transfer channel 23.

The metal layer for forming the pads 31 made of aluminum, copper, gold or platinum surely blocks light as compared with the conductive layer for forming the horizontal transfer electrodes 24 made of polysilicon. Therefore, the pads 31 function as a light shield film for blocking the light incident on the horizontal transfer channel 23. Thus, the solid state imaging device of the present embodiment makes it possible to reduce the chip size and improve the efficiency of signal charge transfer in the horizontal direction.

As the pads 31 for external connection are formed above the horizontal transfer channel 23 which is an impurity diffusion region, it is presumed that damage may be caused on the impurity diffusion region. However, if the interlayer insulating film 30 is thickened or made of different material, the impurity diffusion region may be protected from the damage.

Third Embodiment

Figure 7:
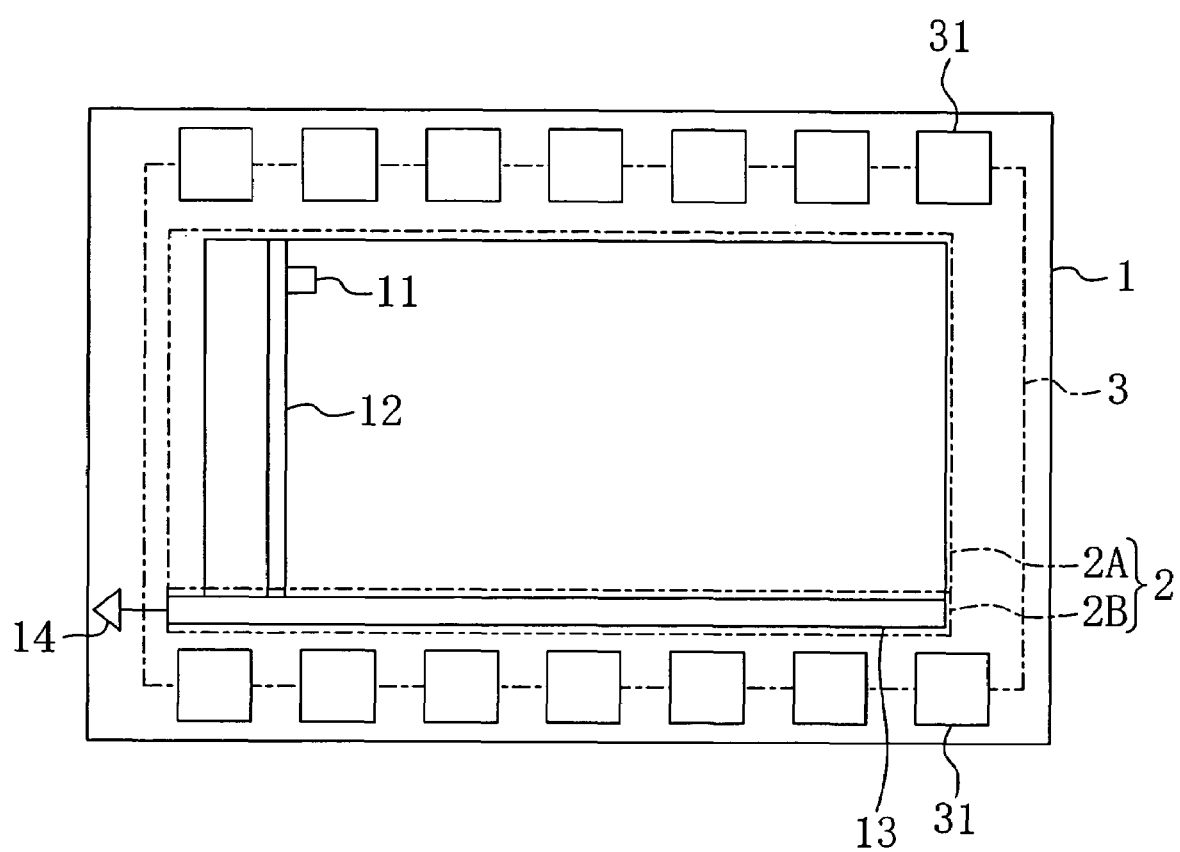
FIG. 7 is a plan view illustrating a solid state imaging device according to a third embodiment of the present invention.
Figure 8:
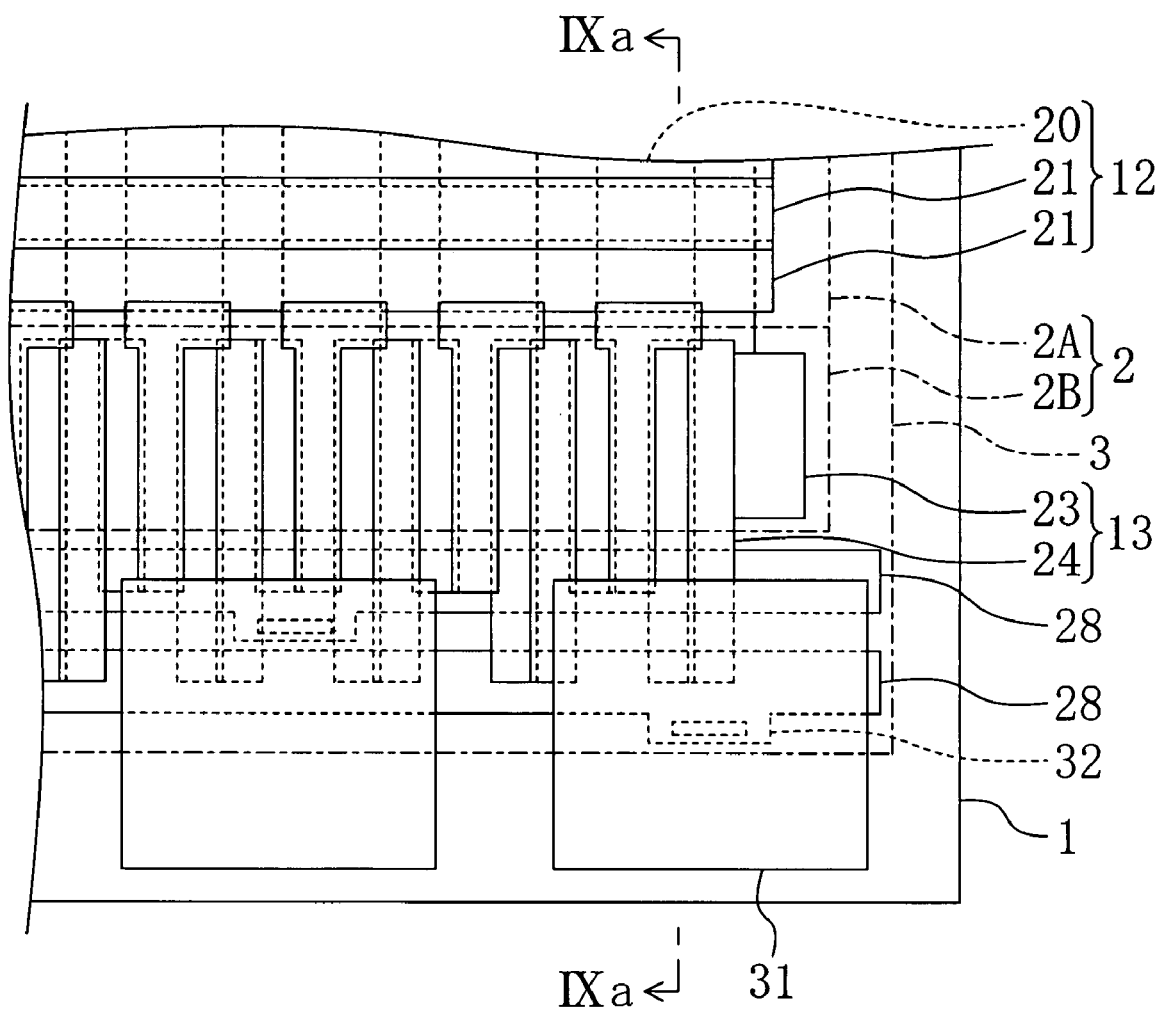
FIG. 8 is a plan view illustrating an enlargement of a major part of the solid state imaging device according to the third embodiment of the present invention.
Figure 9:
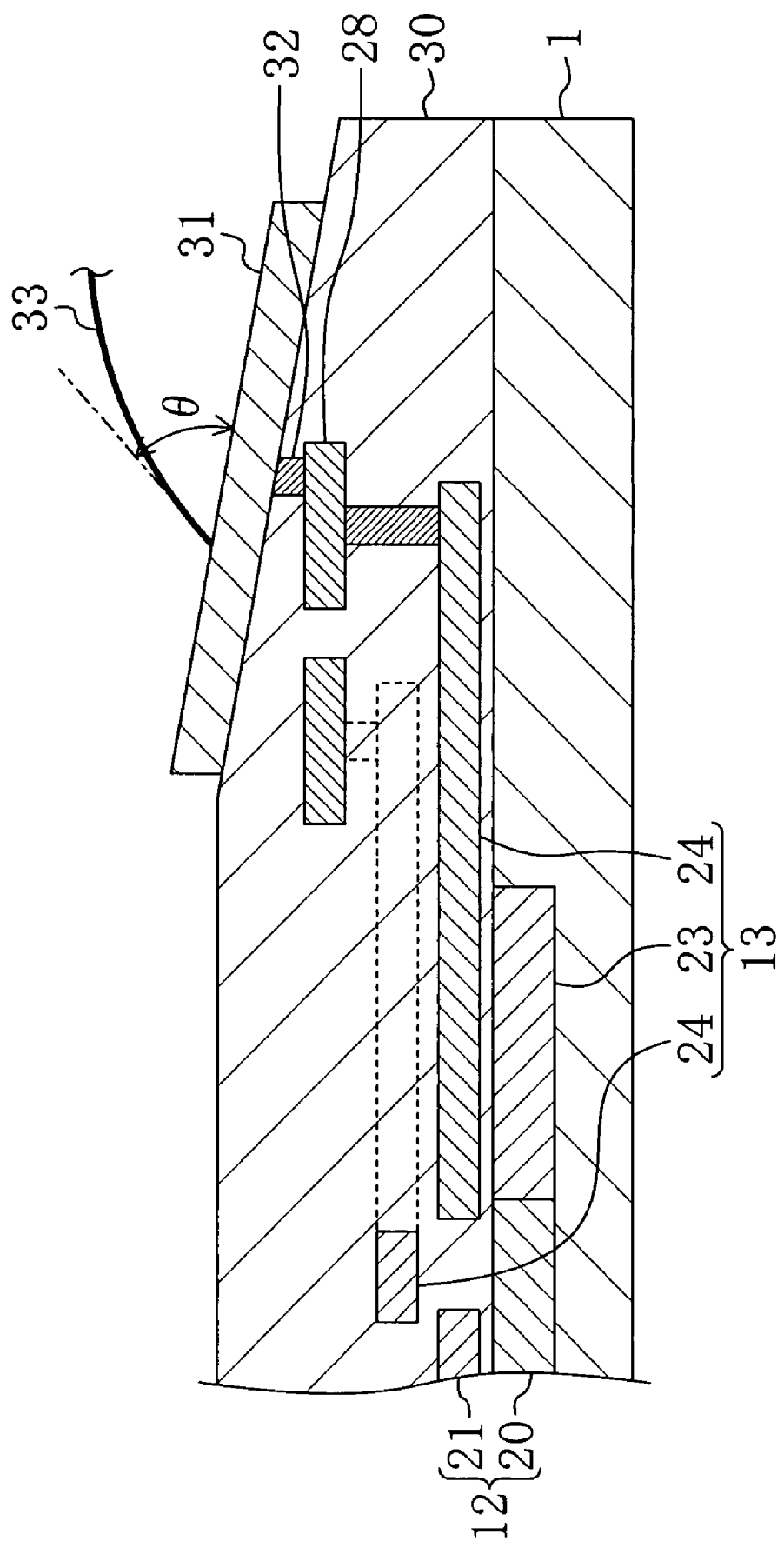
FIG. 9 a sectional view illustrating an enlargement of a major part of the solid state imaging device according to the third embodiment of the present invention.
Figure 10:
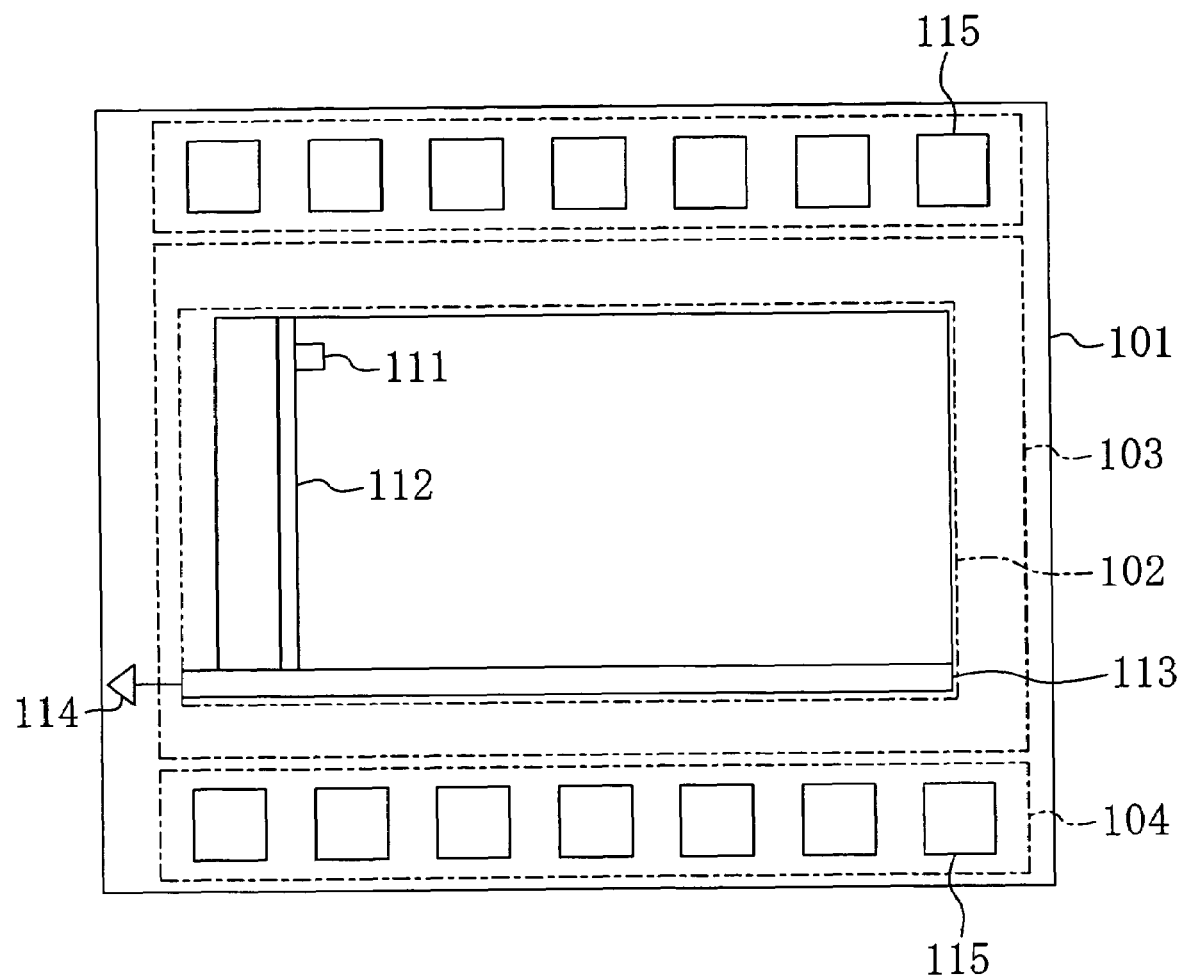
FIG. 10 is a plan view illustrating a conventional solid state imaging device.
Figure 11:
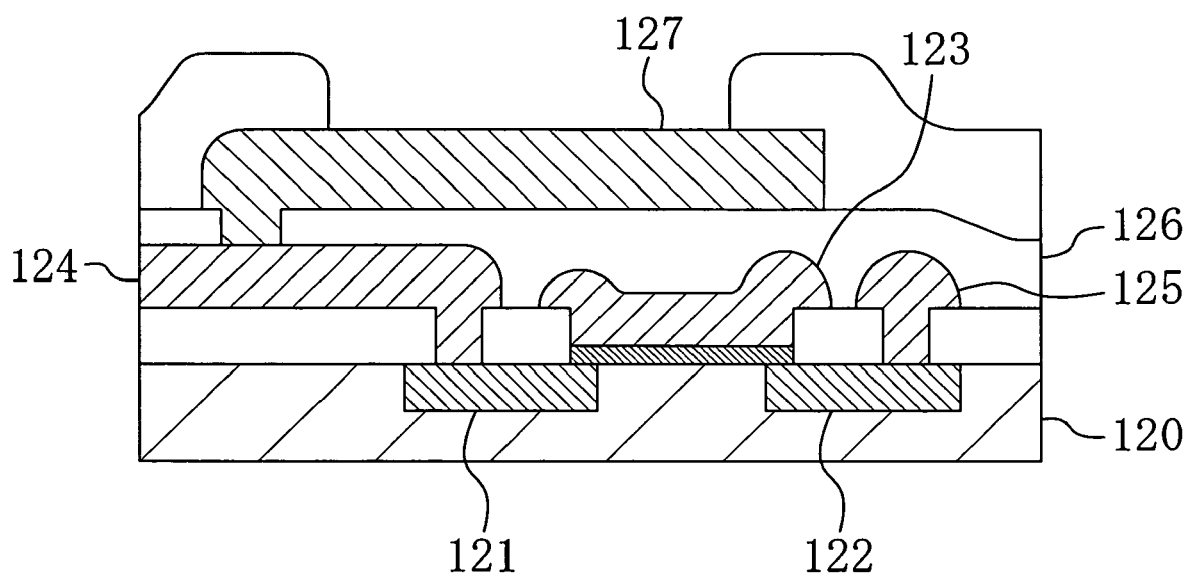
FIG. 11 is a sectional view illustrating a conventional semiconductor device in which a pad is formed over the device region.

Hereinafter, an explanation of a solid state imaging device according to a third embodiment of the present invention will be provided with reference to the drawings. FIGS. 7 to 9 show the solid state imaging device according to the third embodiment. Specifically, FIG. 7 shows a plane structure, FIG. 8 is an enlargement of FIG. 7 and FIG. 9 shows a section taken along the line IXa-IXa of FIG. 8. In FIGS. 7 to 9, the same components as those shown in FIGS. 1 to 3 are indicated by the same reference numerals to omit the explanation.

In the solid state imaging device of the present embodiment, part of the interlayer insulating film 30 in the interconnect region 3 is gradually reduced in thickness toward the periphery of the chip to have an inclined surface and the pads 31 for external connection are formed on the inclined surface.

In order to obtain the inclined surface, a resist mask is formed to cover other part of the interlayer insulating film 30 than the part for giving the inclined surface and the interlayer insulating film 30 is subjected to etching.

If the pads 31 are formed above the interconnect region 3, the distance between the pads 31 and the pixel region 2A is reduced. Therefore, bonding wires 33 connected to the pads 31 may possibly hinder the light from entering the pixels 11.

However, in the solid state imaging device of the present invention, the angle θ formed by the bonding wire 33 and the top surface of the semiconductor chip 1 (mounting angle) is reduced. Therefore, light around the pixels 11 is prevented from reflecting on the bonding wires 33 to enter the pixels 11.

As described above, the solid state imaging device of the present invention effectively increases the ratio of the device region including the pixels to the chip area without hindering the entrance of light into the pixels, thereby improving the packing density of the solid state imaging device. Thus, the present invention is useful for solid state imaging devices.

What is claimed is:

1. A solid state imaging device comprising:
    a plurality of photoelectric conversion elements which are arranged in a two-dimensional matrix on a semiconductor chip;
    vertical transfer registers including a vertical transfer channel and vertical transfer electrodes, respectively, for transferring signal charge read out of the photoelectric conversion elements in the vertical direction;
    a horizontal transfer register including a horizontal transfer channel and horizontal transfer electrodes for transferring the signal charge transferred from the vertical transfer registers in the horizontal direction;
    bus interconnects which are electrically connected to the vertical transfer electrodes and the horizontal transfer electrodes; and
    pads for external connection which are electrically connected to the bus interconnects, wherein
    the pads are formed above the bus interconnects and the horizontal transfer electrodes.

2. The solid state imaging device according to claim 1, wherein
    the pads are located above the horizontal transfer channel.

3. The solid state imaging device according to claim 2, wherein
    the horizontal transfer electrodes are conductive layers and the pads are metal layers.

4. The solid state imaging device according to claim 3, wherein
    the conductive layers are made of polysilicon.

5. The solid state imaging device according to claim 1, wherein
    the pads are inclined from the main surface of the semiconductor chip.

6. The solid state imaging device according to claim 1, wherein
    the pads are electrically connected to the bus interconnects via contact plugs.

7. The solid state imaging device according to claim 1, wherein
    the photoelectric conversion elements, vertical transfer registers and horizontal transfer register provide a CCD image sensor.

* * * * *